United States Patent
Lim

(10) Patent No.: US 9,484,108 B2
(45) Date of Patent: Nov. 1, 2016

(54) INTEGRATED CIRCUIT, SEMICONDUCTOR MEMORY DEVICE, AND OPERATING METHOD THEREOF

(71) Applicant: SK hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 315 days.

(21) Appl. No.: 14/078,048

(22) Filed: Nov. 12, 2013

(65) Prior Publication Data

US 2015/0019886 A1    Jan. 15, 2015

(30) Foreign Application Priority Data

Jul. 15, 2013  (KR) .................. 10-2013-0082903

(51) Int. Cl.
*G11C 16/30* (2006.01)
*G11C 16/26* (2006.01)

(52) U.S. Cl.
CPC ............... *G11C 16/30* (2013.01); *G11C 16/26* (2013.01)

(58) Field of Classification Search
CPC .......... G06F 13/4221; G06F 2212/72; G06F 2212/403; G06F 17/212; G06F 17/30117; G06F 17/30318; G06F 17/3051; G06F 21/554; G06F 21/566; G06F 21/71; G06F 21/78; G06F 21/79; G06F 2201/84; G06F 2212/1052; G06F 2212/2022

USPC .......................................................... 713/193
See application file for complete search history.

(56) References Cited

U.S. PATENT DOCUMENTS

| | | | | |
|---|---|---|---|---|
| 5,936,896 A | * | 8/1999 | Cho | G11C 7/1051 327/108 |
| 8,994,440 B2 | * | 3/2015 | Ryu | G11C 8/08 327/407 |
| 2006/0018157 A1 | * | 1/2006 | Kawai | G11C 29/835 365/185.09 |
| 2012/0221775 A1 | * | 8/2012 | Kim | G06F 21/00 711/103 |
| 2013/0051145 A1 | * | 2/2013 | Ahn | G11C 16/0483 365/185.11 |

FOREIGN PATENT DOCUMENTS

KR    100412134    12/2003

* cited by examiner

*Primary Examiner* — Zahid Choudhury
(74) *Attorney, Agent, or Firm* — IP & T Group LLP

(57) ABSTRACT

An integrated circuit includes an internal circuit including a input/output unit suitable for inputting/outputting data, and a voltage supplying circuit suitable for supplying a first operating voltage to the internal circuit in response to a first control signal during a general operation, and supplying a second operating voltage that is higher than the first operating voltage to the input/output unit in response to a second control signal during an output of the data.

15 Claims, 10 Drawing Sheets

INTEGRATED CIRCUIT, SEMICONDUCTOR MEMORY DEVICE, AND OPERATING METHOD THEREOF

CROSS-REFERENCE TO RELATED APPLICATION

The present application claims priority to Korean patent application number 10-2013-0082903, filed on Jul. 15, 2013, the entire disclosure of which is incorporated herein by reference in its entirety.

BACKGROUND

1. Field of Invention

Exemplary embodiments of the present invention relate to an electronic device, and more particularly, to an integrated circuit, a semiconductor memory device, and an operating method of the semiconductor memory device.

2. Description of Related Art

A semiconductor memory device is generally classified into either a volatile memory device or a non-volatile memory device.

The volatile memory device may perform a read/write operation at a high speed, and may lose stored data when a power supply is blocked. Meanwhile, the non-volatile memory device tends to have a lower speed than the volatile memory device in the read/write operation, and may retain the stored data even when a power supply is blocked. Accordingly, the non-volatile memory device is used to store data to be maintained regardless of supplying of the power. A read only memory (ROM), a mask ROM (MROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM) may be classified as the non-volatile memory device. The flash memory is generally divided into a NOR type flash memory device and a NAND type flash memory device.

The flash memory has an advantage of the RAM in which data is freely programmed and erased, and an advantage of the ROM in which stored data may be maintained even when a power supply is blocked. The flash memory is widely used as a storage medium of a portable electronic device, such as a digital camera, a personal digital assistant (PDA), and an MP3 player.

Recently, demands of users for a memory having high performance increased.

To this end, a semiconductor memory device is required to have a high data input/output rate.

SUMMARY

Various embodiments of the present invention directed to an integrated circuit that may improve a data input/output rate, and a semiconductor memory device and an operating method of the semiconductor memory device.

According to an embodiment of the present invention, an integrated circuit may include an internal circuit including a input/output unit suitable for inputting/outputting data, and a voltage supplying circuit suitable for supplying a first operating voltage to the internal circuit in response to a first control signal during a general operation, and supplying a second operating voltage that is higher than the first operating voltage to the input/output unit in response to a second control signal during an output of the data.

According to another embodiment of the present invention, a semiconductor memory device may include a memory array including a plurality of memory cells, a page buffer including a first latch suitable for temporarily storing data read from the memory cells and outputting the data to an input/output circuit, and a voltage supplying unit suitable for supplying a first operating voltage to the first latch in response to a first control signal during a general operation, and supplying a second operating voltage that is higher than the first operating voltage to the first latch in response to a second control signal during an output of the data.

According to another embodiment of the present invention, a method of operating a semiconductor memory device may include supplying an operating voltage to a first latch and a second latch in a page buffer, boosting the operating voltage in response to a control signal, supplying the boosted operating voltage to the first latch in response to the control signal, and outputting data of the first latch to an input/output circuit.

According to the integrated circuit, the semiconductor memory device, and the method of operating the semiconductor memory device of the embodiments of the present invention, a higher operating voltage is supplied to a latch, to/from which data is input/output while inputting/outputting the data, when compared to a general operation, and thus an input/output rate of data may improve.

Further, a standby current may be decreased compared to when operating voltages of all of the latches are increased during the input/output of the data, and the same operating voltage is supplied to all of the latches during the general operation, thereby resolving concerns occurred in a process of data transmission between latches.

The foregoing summary is illustrative purpose only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
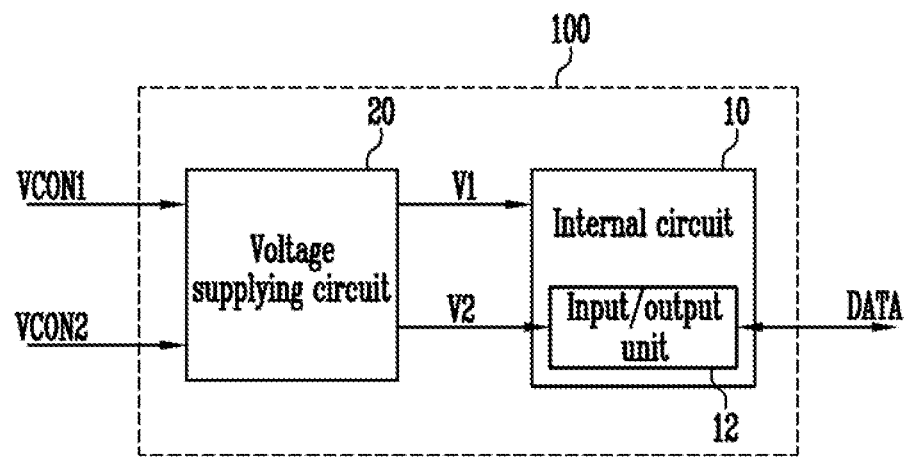
FIG. 1 is a block diagram illustrating an integrated circuit according to an embodiment of the present invention.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a block diagram illustrating an integrated circuit 100 according to an embodiment of the present invention.

Referring to FIG. 1, the integrated circuit 100 includes an internal circuit including an input/output unit 12 configured to input/output data, and a voltage supplying circuit 20.

The voltage supplying circuit 20 supplies a first voltage V1 to the internal circuit 10 including the input/output unit 12 as an operating voltage in response to a first control signal VCON while performing a general operation. The voltage supplying circuit 20 may supply a second voltage V2 that is higher than the first voltage V1 to the input/output unit 12 in response to a second control signal VCON2 input when outputting data DATA.

Accordingly, the data input device may improve a data output rate by applying a higher operating voltage to the input/output circuit when outputting the data compared to the general operation.

Further, the first voltage V1 is supplied to the internal circuit 10 including the input/output unit 12 as an operating voltage during the general operation, and the second voltage V2 that is higher than the first voltage V1 is supplied to the input/output unit 12 as the operating voltage during the output of the data, so that an increase in a standby current may be prevented.

The voltage supplying circuit 20 may supply the second voltage V2 to the input/output unit 12 in response to the second control signal VCON while the data is input. Accordingly, it may be possible to improve a data input rate as well as a data output rate.

Figure 2:
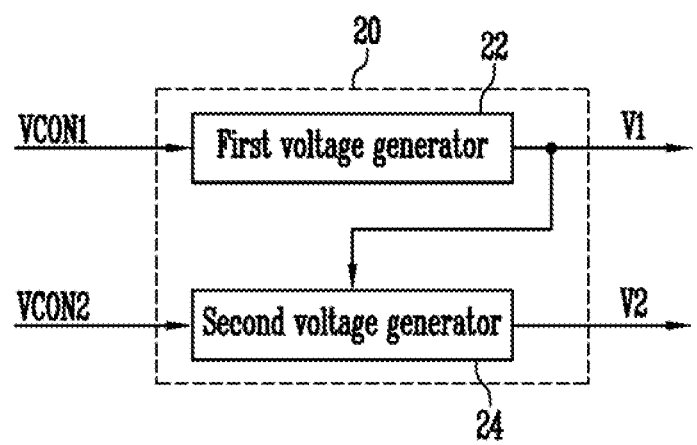
FIG. 2 is a detailed diagram illustrating a voltage supplying circuit shown in FIG. 1.

FIG. 2 is a detailed diagram illustrating the voltage supplying circuit 20 shown in FIG. 1.

Referring to FIG. 2, the voltage supplying circuit 20 includes a first voltage generator 22 configured to generate the first voltage V1 in response to the first control signal VCON1, and a second voltage generator 24 configured to generate the second voltage V2 in response to the second control signal VCON2.

The second voltage generator 24 may generate the second voltage V2 by boosting the first voltage V1 in response to the second control signal VCON2. The second voltage generator 24 generates the second voltage V2 by boosting the first voltage V1, thereby decreasing a time taken for generating the second voltage V2.

Figure 3:
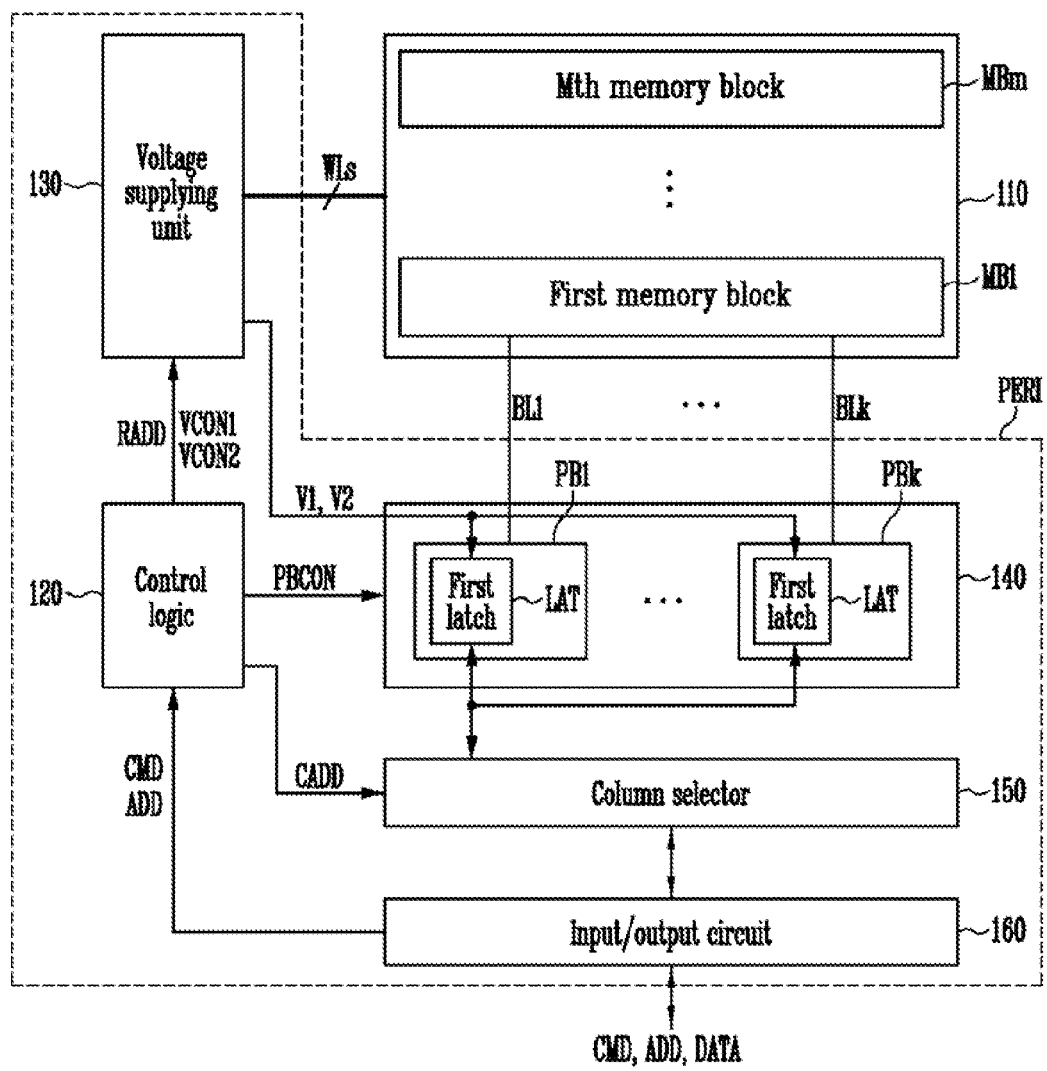
FIG. 3 is a block diagram illustrating a semiconductor memory device according to an embodiment of the present invention.
Figure 4:
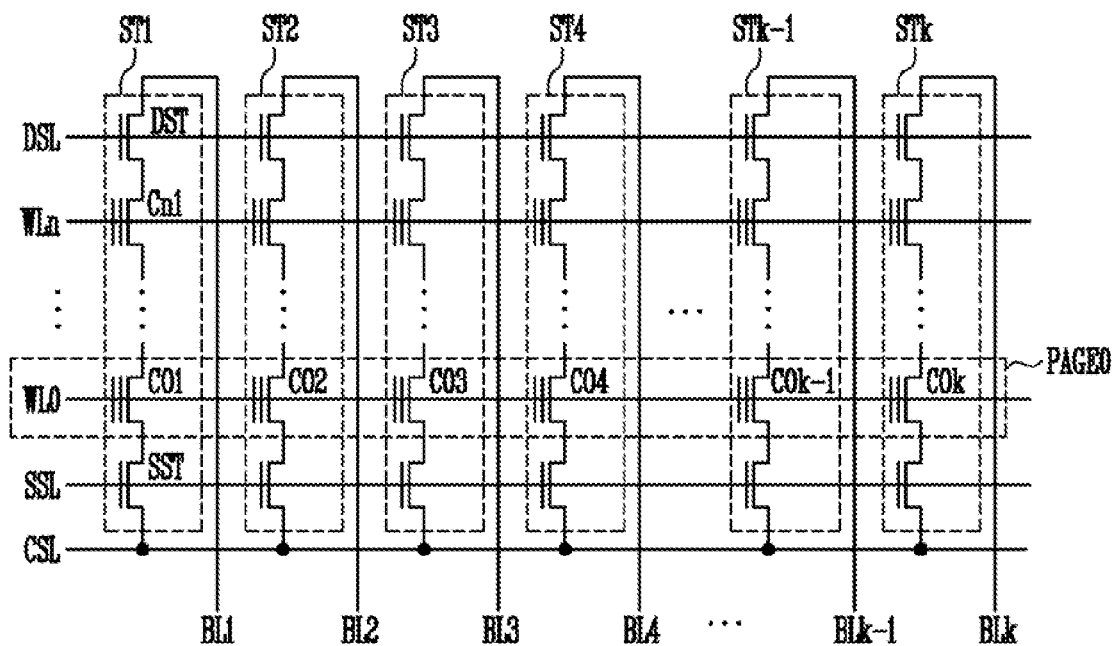
FIG. 4 is a detailed diagram illustrating a memory block shown in FIG. 3.

FIG. 3 is a block diagram illustrating a semiconductor memory device according to an embodiment of the present invention. FIG. 4 is a detailed diagram illustrating a memory block shown in FIG. 3.

Referring to FIG. 3, the semiconductor memory device according to the embodiment of the present invention includes a memory array 110 including first to $m^{th}$ memory blocks MB1 to MBm, and a peripheral circuit PERI configured to perform a read operation of memory cells included in a selected page of the memory blocks MB1 to MBm. The peripheral circuit PERI includes a control logic 120, a voltage supplying unit 130, a page buffer group 140, a column selector 150, and an input/output circuit 160.

Referring to FIG. 4, each memory block includes a plurality of strings ST1 to STk connected between bit lines BL1 to BLk and a common source line CSL. That is, the strings ST1 to STk are connected to the corresponding bit lines BL1 to BLk, respectively, and are commonly connected to the common source line CSL. Each string ST1 includes a source select transistor SST in which a source is connected to the common source line CSL, a plurality of memory cells C01 to Cn1, and a drain select transistor DST in which a drain is connected to the bit line BL1. The memory cells C01 to Cn1 are serially connected between the select transistors SST and DST. A gate of the source select transistor SST is connected to the source select line SSL, and gates of the memory cells C01 to Cn1 are connected to word lines WL0 to WLn, respectively. A gate of the drain select transistor DST is connected to a drain select line DSL.

The memory cells included in the memory block in a NAND flash memory device may be divided in unit of page. For example, the memory cells C01 to C0k connected to one word lines, for example, WL0, form one page PAGE0. The page is a basic unit of the read operation.

The control logic 120 outputs a voltage control signal for generating a voltage necessary for performing the read operation in response to a command CMD input through the input/output circuit 160 from the outside, and particularly, outputs the voltage control signals VCON1 and VCON2 for generating the first voltage V1 and the second voltage V2 supplied to a first latch LAT of each page buffer within the page buffer group 140. The control logic 120 may output the voltage control signal VCON2 after the data is stored in the first latch and before the data is output. The data may be random data, as well as the data read from the memory cells. The control logic 120 outputs a page buffer (PB) control signal PBCON for controlling page buffers PB1 to PBk included in the page buffer group 140. An operation of controlling the page buffer group 140 by the control logic 120 will be described below. Further, the control logic 120 outputs a row address signal RADD and a column address signal CADD based on an address signal ADD input from the outside through the input/output circuit 160.

The voltage supplying unit 130 supplies operating voltages necessary for the read operation of the memory cells to local lines including the drain select line DLS, the word lines WL0 to WLn, and the source select line SSL of a selected memory block in response to the voltage control signal of the control logic 120. Particularly, the voltage supplying unit 130 supplies the first voltage V1 and the second voltage V2 to the first latch LAT of each page buffer within the page buffer group 140 as an operating voltage in response to the voltage control signals VCON1 and VCON2 of the control logic 120. The voltage supplying unit 130 supplies the first voltage V1 to the first latch LAT as the operating voltage in response to the first voltage control signal VCON1 while the general operation is performed, and supplies the second voltage V2 that is higher than the first voltage V1 to the first latch LAT in response to the second voltage control signal VCON2 while the data is output. The data may be random data, as well as the data read from the memory cells. The voltage supplying unit 130 includes a voltage generating circuit and a row decoder.

The voltage generating circuit outputs the operating voltages necessary for the read operation of the memory cells to global lines in response to the voltage control signal. For the read operation, the voltage generating circuit outputs a read voltage to be applied to the memory cells of the selected page, and a pass voltage to be applied to non-selected memory cells to the global lines. The voltage generating circuit includes a first voltage generator configured to generate the first voltage V1 in response to the first voltage control signal VCON1, and a second voltage generator configured to generate the second voltage V1 in response to the second control signal VCON2. The second voltage generator may generate the second voltage V2 by boosting the first voltage V1 in response to the second control signal VCON2. The second voltage generator generates the second voltage V2 by boosting the first voltage V1, thereby decreasing a time taken for generating the second voltage V2.

The row decoder connects the global lines and the local lines DSL, WL0 to WLn, and SSL so that the operating voltages output from the voltage generating circuit to the global lines are transmitted to the local lines DSL, WL0 to WLn, and SSL of a selected memory block in the memory array 110 based on the row address signals RADD of the control logic 120. Accordingly, the read voltage is applied to the local word line, for example, WL0, connected with a selected cell, for example C01, from the voltage generating circuit through the global word line. Further, the pass voltage is supplied to the local word lines, for example, WL1 to WLn, connected with non-selected cells C11 to Cn1 from the voltage generating circuit through the global word lines. Accordingly, the data stored in the selected cell C01 is read by the read voltage.

The page buffer group 140 includes the page buffers PB1 to PBk connected with the memory array 110 through the bit lines BL1 to BLk. The page buffers PB1 to PBk of the page buffer group 140 selectively precharge the bit lines BL1 to BLk based on input data to store the data in the memory cells C01 to C0k in response to the PB control signal PBCON of the control logic 120, or sense the voltages of the bit lines BL1 to BLK to read the data from the memory cells C01 to C0k. The page buffers PB1 to PBk includes the first latches LATs, and the first voltage V1 is supplied to the first latch LAT as an operating voltage during the general operation, and the second voltage V2 that is higher than the first voltage V1 is supplied to the first latch LAT as the operating voltage during the output of the data read from the memory cells C01 to C0k or random data. The second voltage V2 may be supplied to the first latch LAT as the operating voltage during the input of the data to be stored in the memory cells C01 to C0k or random data.

For example, during the read operation, the page buffer group 140 discharges all of the selected bit lines and discharges all of the non-selected bit lines. Further, when the read voltage is applied to the selected word line WL0 from the voltage supplying unit 130, the bit lines of the memory cells in which program data is stored are maintained in a precharge state, and the bit lines of the memory cells in which erase data is stored are discharged. The page buffer group 140 senses voltage changes of the bit lines BL1 to BLk and latches the data of the memory cells corresponding to the sensing result.

A detailed configuration of the page buffer will be described later.

The column selector 150 selects the page buffers PB1 to PBk included in the page buffer group 140 in response to the column address signal CADD output from the control logic 120. That is, the column selector 150 sequentially transmits the data to be stored in the memory cells to the page buffers PB1 to PBk in response to the column address signal CADD. Further, the column selector 150 sequentially selects the page buffers PB1 to PBk in response to the column address signal CADD so that the data of the memory cells latched in the page buffers PB1 to PBk by the read operation is output to the outside.

The input/output circuit 160 transmits the data to the column selector 150 under the control of the control logic 120 to input the data input from the outside to be stored in the memory cells to the page buffer group 140 during the program operation. When the column selector 150 transmits the data transmitted from the input/output circuit 160 to the page buffers PB1 to PBk of the page buffer group 140 according to the aforementioned method, the page buffers PB1 to PBk store the Input data in internal latch circuits. Further, the input/output circuit 160 outputs the data transmitted through the column selector 150 from the page buffers PB1 to PBk of the page buffer group 140 to the outside during the read operation.

Figure 5:
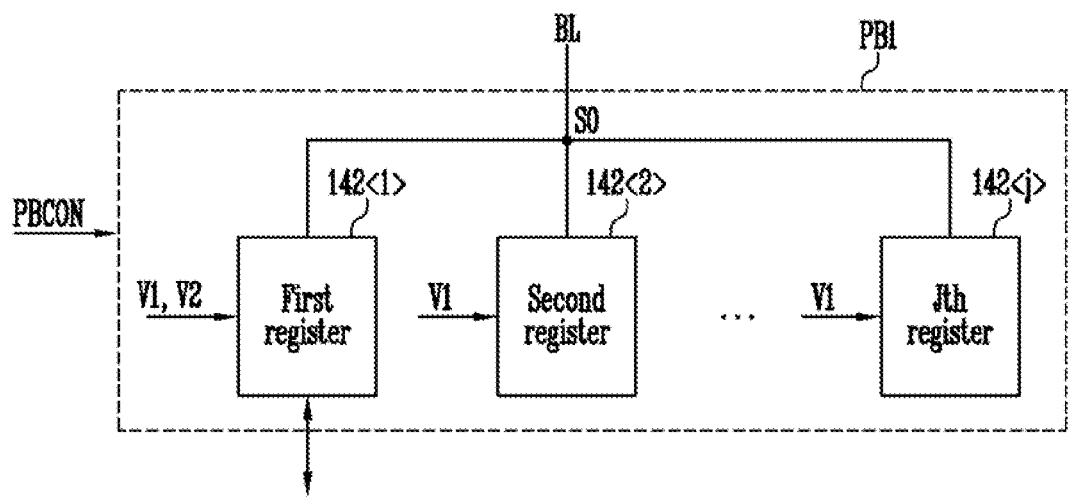
FIG. 5 is a detailed diagram illustrating a page buffer shown in FIG. 3.

FIG. 5 is a detailed diagram illustrating the page buffer PB1 shown in FIG. 3.

Referring to FIG. 5, the page buffer PB1 is operated in response to the PB control signal PBCON output from the control logic (reference numeral 120 of FIG. 1). The page buffer includes first to $j^{th}$ registers 142<1> to 142<j>. The first to $j^{th}$ registers 142<1> to 142<j> are connected to the bit line BL in parallel, a connection node of the bit line BL and the first to $j^{th}$ registers 142<1> to 142<j> is a sensing node SO.

The number of registers may be changed depending on a design, and in FIG. 3, a case where j registers are included will be described as an example (j is a natural number greater than '1').

The first register 142<1> may perform an operation of temporarily storing the data input from the column selector 150 and transmitting the temporarily stored data to the second register 142<2>, or temporarily storing the data read from the memory cell by the read operation or random data to output the data read from the memory cell by the read operation or random data to the column selector 150. The first register 142<1> receives the second voltage V2 that is higher than the first voltage V1 as an operating voltage when outputting the data read from the memory cell by the read operation or random data to the column selector 150, and receives the first voltage V1 as the operating voltage while performing the general operation. The first register 142<1> may receive the second voltage V2 as the operating voltage even when the data is input from the column selector 150.

The second register 142<2> may perform an operation of applying a program inhibition voltage or a program permission voltage to the bit line during the program operation based on the data transmitted from the first register 142<1>. Further, the second register 142<2> may also perform an operation of temporarily storing the data stored in the memory cell in response to the voltage of the bit line and transmitting the temporarily stored data to the first register 142<1> during the read operation. The second register 142<2> receives the first voltage V1 as the operating voltage.

The $j^{th}$ resister 142<j> may perform an operation of latching a comparison result value of a threshold voltage of the memory cell and a target voltage in a verification operation performed after the program operation, and output a comparison result signal corresponding to the comparison result value. The $j^{th}$ register 142<j> receives the first voltage V1 as the operating voltage.

Figure 6:
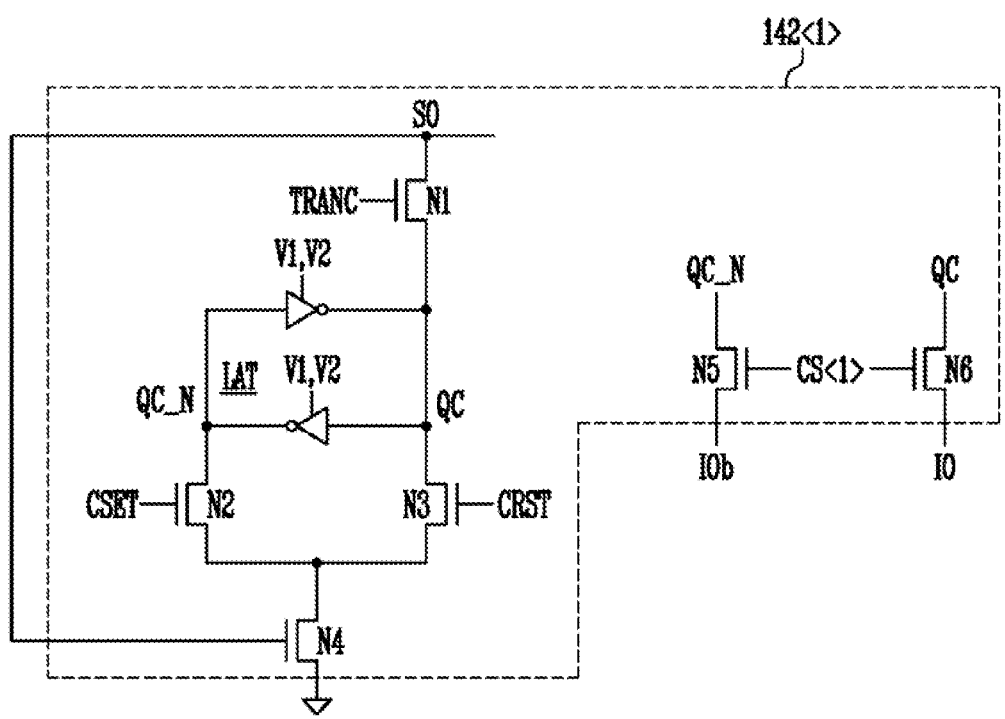
FIG. 6 is a detailed diagram illustrating a first register shown in FIG. 5.

FIG. 6 is a detailed diagram illustrating the first register 142<1> shown in FIG. 5.

Referring to FIG. 6, the first register 142<1> includes a plurality of switching elements and the latch. Signals PRE-CHb, TRANT, TRANM, TRST, TSET, MRST, MSET, and PBSENSE to be described below may be output from the control logic.

The first register 142<1> includes the latch LAT for latching the data, a switching element N1 configured to connect a first node QC of the latch LAT and the sensing node SO in response to a transmission signal TRANC, switching elements N2 and N3 connected with a second node QC_N and the first node QC of the latch LAT, respectively, and operated in response to a set signal SET and a reset signal RST, respectively, a switching element N4 connected between the switching elements N2 and N3 and a ground terminal and operated based on a potential of the sensing node SO, a switching element N5 configured to connect the second node QC_N of the latch LAT and an Inversion data line (or a negative data line) IOb in response to the column selection signal CS<1>, and a switching element N6 configured to connect the first node QC of the latch LAT and a non-inversion data line (or a positive data line) 10 in response to the column selection signal CS<1>.

The latch LAT receives the second voltage V2 that is higher than the first voltage V1 as an operating voltage when outputting the data read from the memory cell by the read operation or random data to the column selector 150, and receives the first voltage V1 as the operating voltage while performing the general operation. The latch LAT may receive the second voltage V2 as the operating voltage even when the data is input from the column selector 150. The first voltage V1 is supplied to other registers 142<2> to 142<j>, except for the first register 142<1>, as the operating voltage.

In the meantime, since signals with different waveforms are input to other registers 142<2> to 142<j>, even though other registers 142<2> to 142<j> are formed in the same configuration, only one register may be activated or other registers 142<2> to 142<J> may perform different functions.

As described above, the first voltage V1 is supplied to the latch LAT of the first register 142<1> of the page buffer as the operating voltage during the general operation, and the second voltage V2 that is higher than the first voltage is supplied to the latch LAT of the first register 142<1> of the page buffer during the input/output of the data. Accordingly, the semiconductor memory device applies a higher operating voltage to the latch LAT while inputting/outputting the data, when compared to the general operation, thereby improving a data input/output rate.

Further, the first voltage V1 is supplied to the latches of other registers 142<2> to 142<j> including the latch LAT of the first register 142<1> as the operating voltage during the general operation, and the second voltage V2 that is higher than the first voltage V1 is supplied to the latch LAT of the first register 142<1> as the operating voltage during the output of the data, so that it may be possible to prevent a standby current from being increased, and may alleviate concerns occurred during a process of a data transmission between the latches of the registers.

Figure 7:
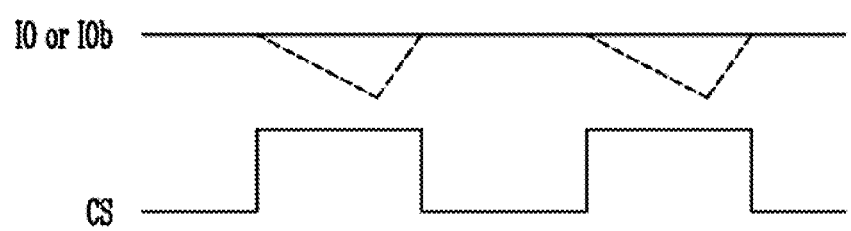
FIG. 7 is a waveform diagram explaining data output operation by the first register shown in FIG. 6.

FIG. 7 is a waveform diagram for explaining data output operation by the first register 142<1> shown in FIG. 6.

Referring to FIG. 7, the inversion and non-inversion data lines IOb/IO are precharged before data is output. The column selector generates a column selection signal CS based on a column address of the control logic. The data stored in the latch is output to the inversion and non-inversion data lines IOb/IO in response to the column selection signal CS. When the data stored in the latch is data "0", the non-inversion data line 10 is discharged, and the inversion data line IOb is maintained in a precharge state.

When the data stored in the latch is data "1", the inversion data line IOb is discharged, and the non-inversion data line IO is maintained in a precharge state. The data is output to the input/output circuit by amplifying and sensing the inversion and non-inversion data lines IOb/IO through a sense amplifier.

Accordingly, a higher operating voltage is supplied to the latch, to/from which data is input/output while inputting/outputting the data, when compared to a general operation, so that it may be possible to improve a data input/output rate by decreasing a time for developing the inversion and non-inversion data lines IOb/IO.

The standby current may be decreased, when compared to a case where the operating voltages of all of the latches are increased during the input/output of the data, and it may be possible to resolve concerns occurred in the process of the data transmission between the latches by supplying the same operating voltage to all of the latches during the general operation.

Figure 8:
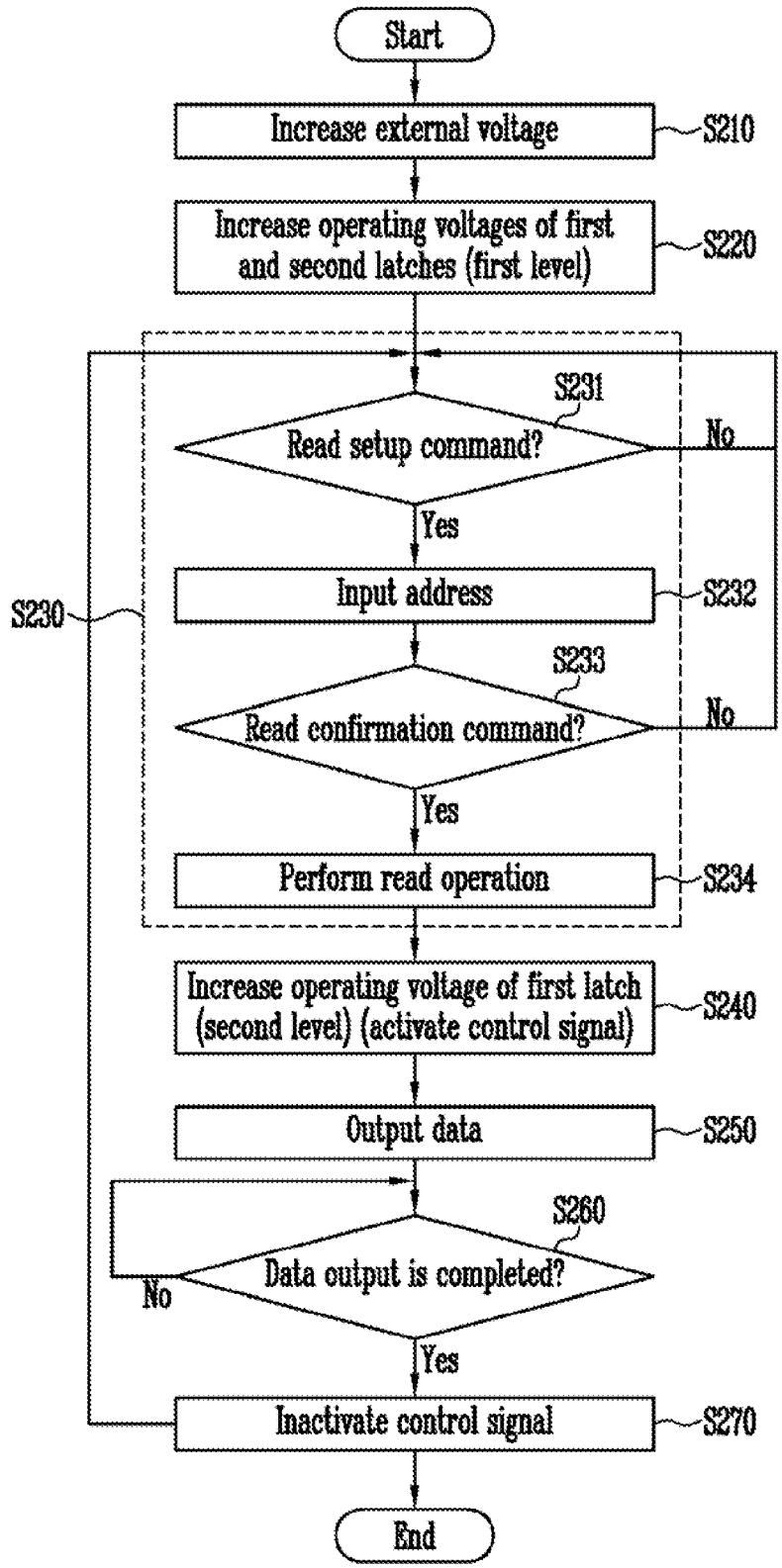
FIG. 8 is a flowchart illustrating an operating method of the semiconductor memory device according to an embodiment of the present invention.
Figure 9:
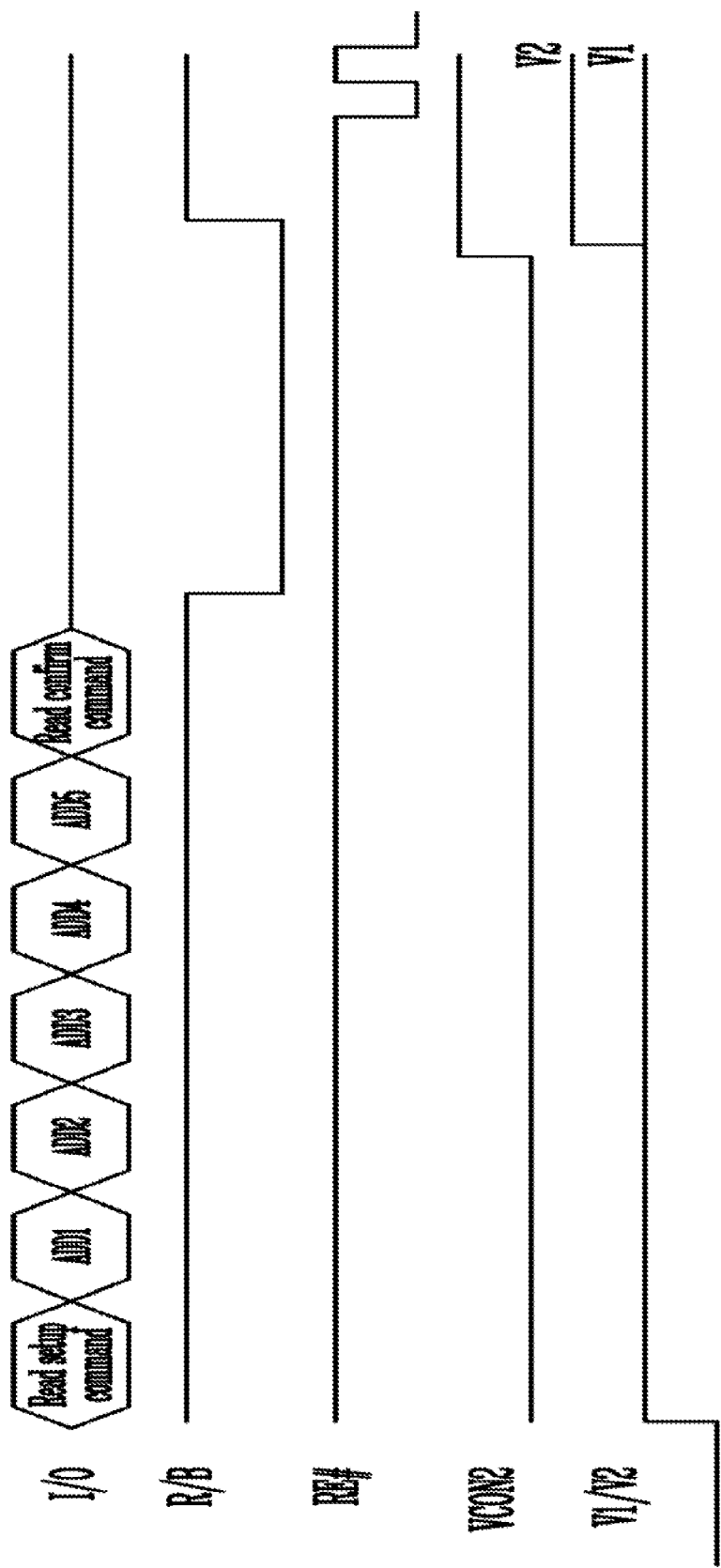
FIG. 9 is a waveform diagram explaining the operating method of the semiconductor memory device shown in FIG. 8.

FIG. 8 is a flowchart illustrating an operating method of the semiconductor memory device according to an embodiment of the present invention. FIG. 9 is a waveform diagram for explaining the operating method of the semiconductor memory device shown in FIG. 8.

Referring to FIG. 8, an operating voltage applied from the outside is increased at step S210, so that operating voltages applied to the first latch and the second latch of the page buffer are increased up to a first level V1 at step S220.

Next, the read data is stored in the first latch by performing the read operation on the memory cells at step S230.

Particularly, referring to FIGS. 8 and 9, a read setup command is input to the input/output circuit I/O at step S231, and addresses ADD1 to ADD5 are input to the input/output circuit I/O at step S232, and then a read confirmation command is input to the input/output circuit I/O at step S233.

When a ready/busy R/B state is changed from a high level to a low level in response to the input of the read confirmation command, the read operation is performed at step S234.

A control signal VCON2 is activated before the performance of the read operation is completed and the ready/busy R/B state is changed from the low level to the high level, and the operating voltage of the first latch is increased to a second level that is higher than the first level in response to the control signal VCON2 at step S240. In this case, the operating voltage of the first latch may be increased to the second level by boosting the operating voltage with the first level.

When the read operation is completed, so that the data is stored in the first latch of the page buffer, the data is output to the input/output circuit in response to a data output signal at step S250. A read enable signal RE# may be used as the data output signal by toggling the read enable signal RE#.

Next, it is checked whether the output of the data is completed at step S260, and when the output of the data is completed, the control signal VCON2 is not activated at step S270. When the control signal VCON2 is not activated, the operating voltages of all of the latches including the first latch are dropped to the first level V1. Whether the output of the data is completed may be recognized through the control logic of FIG. 1.

Figure 10:
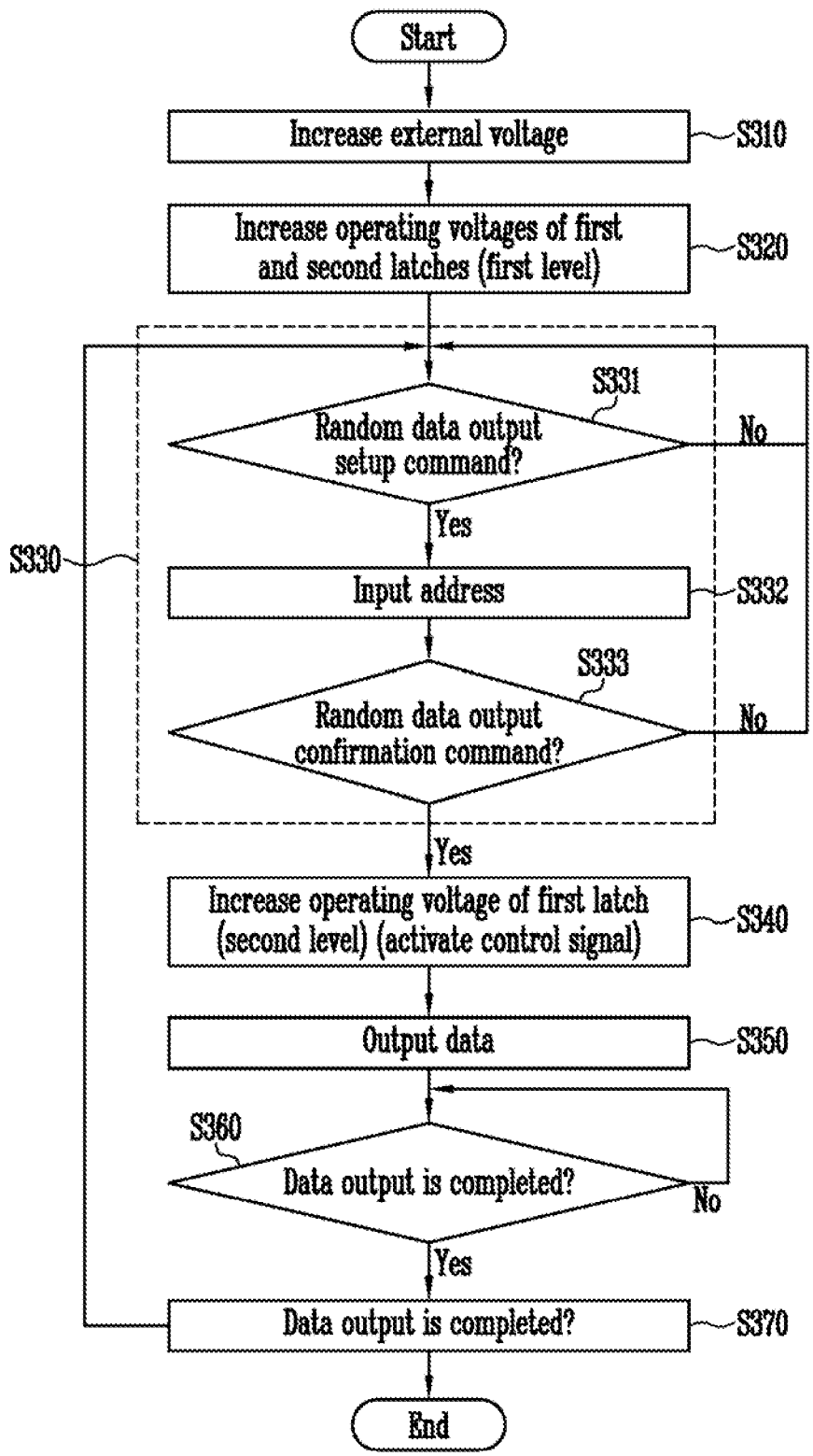
FIG. 10 is a flowchart illustrating an operating method of a semiconductor memory device according to an embodiment of the present invention.
Figure 11:
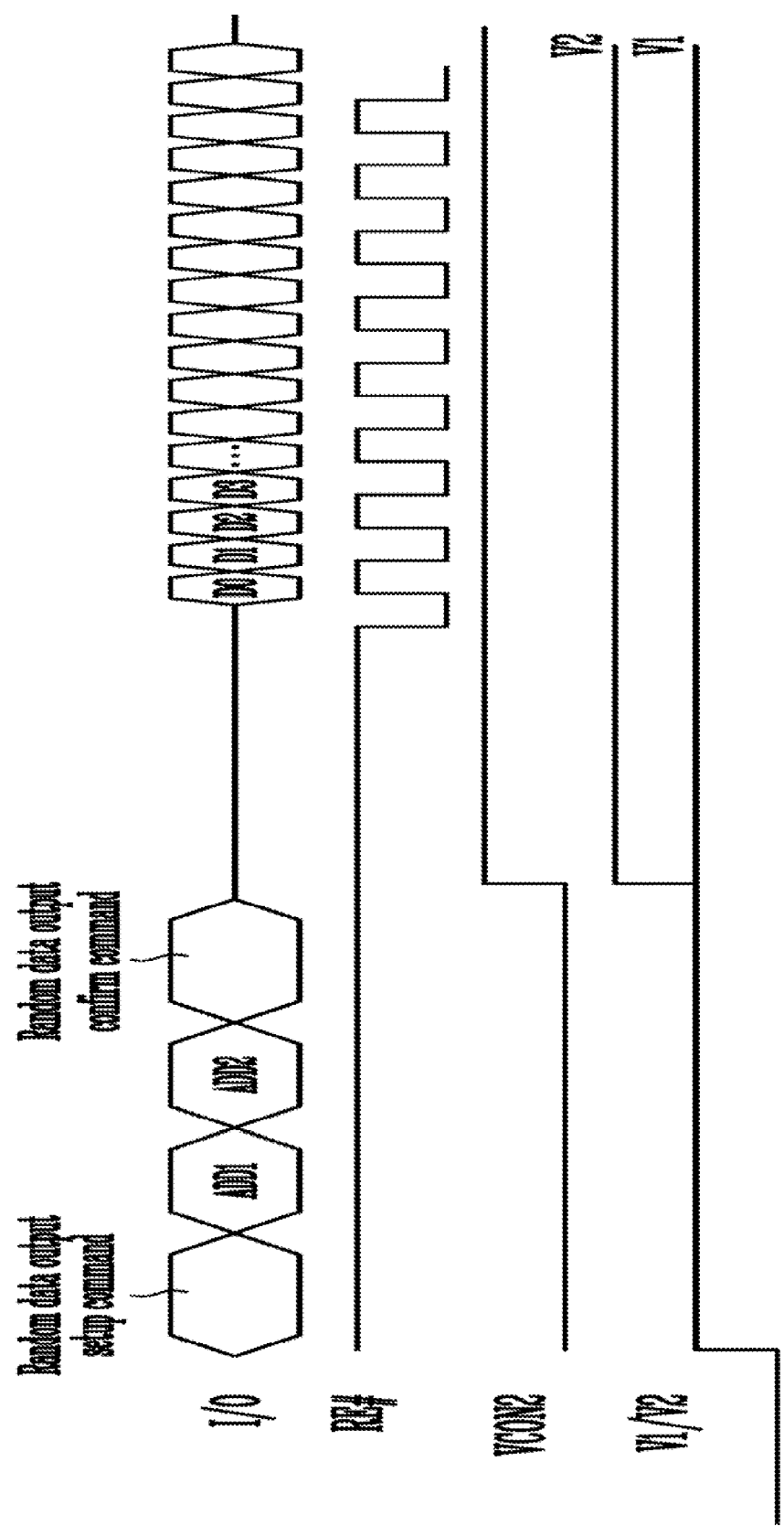
FIG. 11 is a waveform diagram explaining the operating method of the semiconductor memory device shown in FIG. 10.

FIG. 10 is a flowchart illustrating an operating method of a semiconductor memory device according to another embodiment of the present invention. FIG. 11 is a waveform diagram for explaining the operating method of the semiconductor memory device shown in FIG. 10.

Referring to FIG. 10, an operating voltage applied from the outside is increased at step S310, so that operating voltages applied to the first latch and the second latch of the page buffer are increased up to a first level V1 at step S320.

Then, a command set for outputting random data is input at step S330.

Particularly, referring to FIGS. 8 and 9, a random data output setup command is input to the input/output circuit I/O at step S331, and addresses ADD1 to ADD5 are input to the input/output circuit I/O at step S332, and then a random data output confirmation command is input to the input/output circuit I/O at step S333.

A control signal VCON2 is activated in response to the input of the random data output confirmation command, and the operating voltage of the first latch is increased to a second level that is higher than the first level in response to the control signal VCON2 at step S340.

Next, the data is output to the input/output circuit in response to a data output signal at step S350. A read enable signal RE# may be used as the data output signal by toggling the read enable signal RE#.

Next, it is checked whether the output of the data is completed at step S360, and when the output of the data is completed, the control signal VCON2 is not activated at step S370. When the control signal VCON2 is not activated, the operating voltages of all of the latches including the first latch are dropped to the first level V1. Whether the output of the data is completed may be recognized through the control logic of FIG. 1.

As described above, the operating method of the semiconductor memory device according to the embodiment of the present invention may improve a data input/output rate by supplying a higher operating voltage to the latch, to/from which data is input/output while inputting/outputting the data, when compared to a general operation.

Further, the standby current may be decreased compared to a case where the operating voltages of all of the latches are increased during the input/output of the data, and it may be possible to resolve concerns occurred in the process of the data transmission between the latches by supplying the same operating voltage to all of the latches during the general operation.

Figure 12:
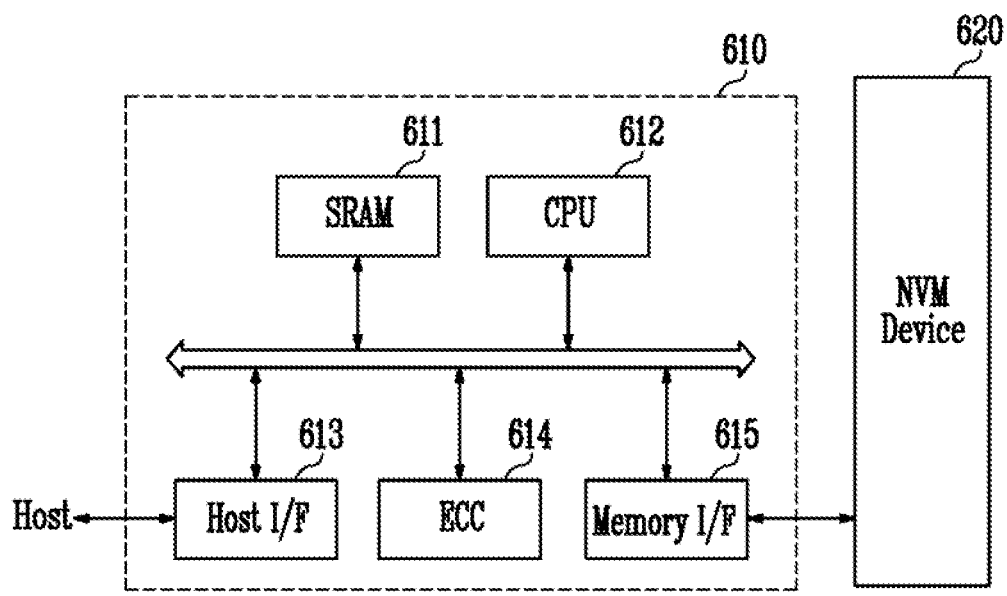
FIG. 12 is a block diagram illustrating a memory system according to the embodiment of the present invention.

FIG. 12 is a block diagram illustrating a memory system 600 according to the embodiment of the present invention.

Referring to FIG. 12, the memory system 600 includes a non-volatile memory device (NVM device) 620 and a memory controller 610.

The non-volatile memory device 620 may include the aforementioned semiconductor memory device for compatibility with the memory controller 610, and may be operated by the aforementioned method. That is, it may be possible to improve a data input/output rate by supplying a large operating voltage to a latch, to/from which data is input/output while inputting/outputting the data, when compared to a general operation. The memory controller 610 may control the non-volatile memory device 620. The data may be provided to a memory card or a semiconductor disk device, for example, a solid-state disk (SSD) by a combination of the non-volatile memory device 620 and the memory controller 610. The static random access memory (SRAM) 611 is used as a working memory of a processing unit (CPU) 612. The host interface (host I/F) 613 includes a data exchange protocol of a host connected with the memory system 600. An error correction circuit (ECC) 614 detects and corrects an error included in the data read from the non-volatile memory device 620. A memory interface (memory I/F) 615 interfaces with the non-volatile memory device 620 of the embodiment of the present invention. The CPU 612 performs a general control operation for the data exchange of the memory controller 610.

Although it is not illustrated in the drawing, it may be apparent to those skilled in the art that the memory system 600 according to the embodiment of the present invention may further include a ROM (not shown) storing code data for interfacing with the host. The non-volatile memory device 620 may also be provided in a form of a multi-chip package including a plurality of flash memory chips. The memory system 600 of the embodiment of the present invention may be provided as a storage medium having a low error rate and high reliability. For example, it may be assumed that the memory system 800 is an SSD. The memory controller 610 may communicate with an external device, for example, the host, through one of various interface protocols, such as a universal serial bus (USB), a multi-media card (MMC), a peripheral component interconnection (PCI), a PCI-express (PCI-E), a parallel advanced technology attachment (PATA), a serial ATA (SATA), an small computer system interface (SCSI), an enhanced small device interface (ESDI), and an integrated drive electronics (IDE).

Accordingly, the memory system 600 according to the embodiment of the present invention may decrease a standby current while having a high data input/output rate, and may resolve concerns occurred in the process of the data transmission.

Figure 13:
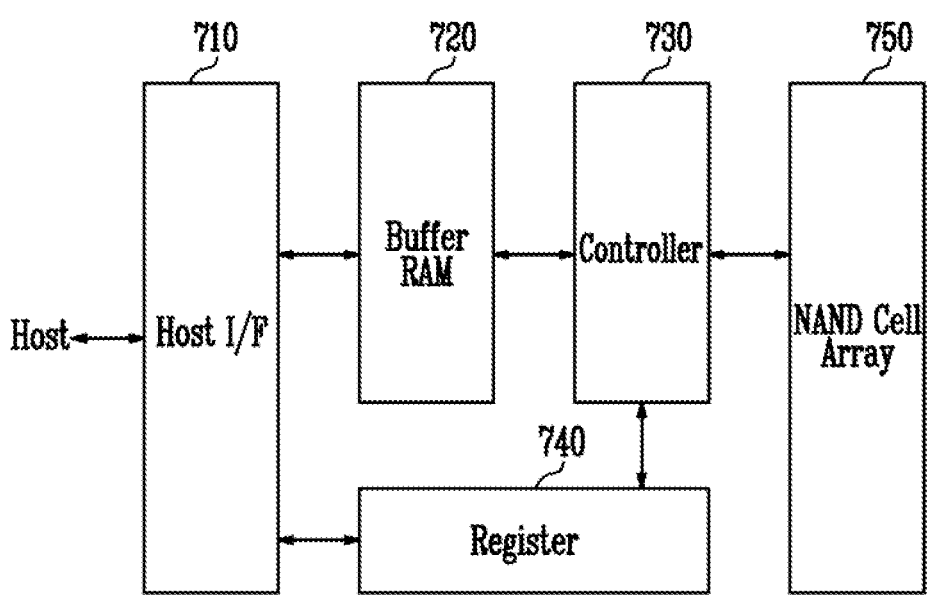
FIG. 13 is a block diagram illustrating a fusion memory device or a fusion memory system performing an operation according to aforementioned various embodiments.

FIG. 13 is a block diagram illustrating a fusion memory device or a fusion memory system performing an operation according to aforementioned various embodiments. For example, the technical features of the embodiment of the present invention may be applied a OneNAND flash memory device 700 as a fusion memory device.

The OneNAND flash memory device 700 includes a host interface 710 for exchanging various information with a device using different protocols, a buffer random access memory (RAM) 720 including a code for driving the memory device or temporarily storing data, a controller 730 configured to control a read, a program, and all states in response to a control signal and a command provided from the outside, a register 740 storing a command, an address, and data, such as configuration, defining a system operating environment within the memory device, and a NAND flash cell array 750 formed of the operating circuit including a non-volatile memory cell and a page buffer. The OneNAND flash memory device inputs/outputs the data in response to a write/read request from the host by the aforementioned method.

Accordingly, the OneNAND flash memory device 700 according to the embodiment of the present invention may decrease a standby current while having a high data input/output rate, and may resolve concerns occurred in a process of data transmission.

Figure 14:
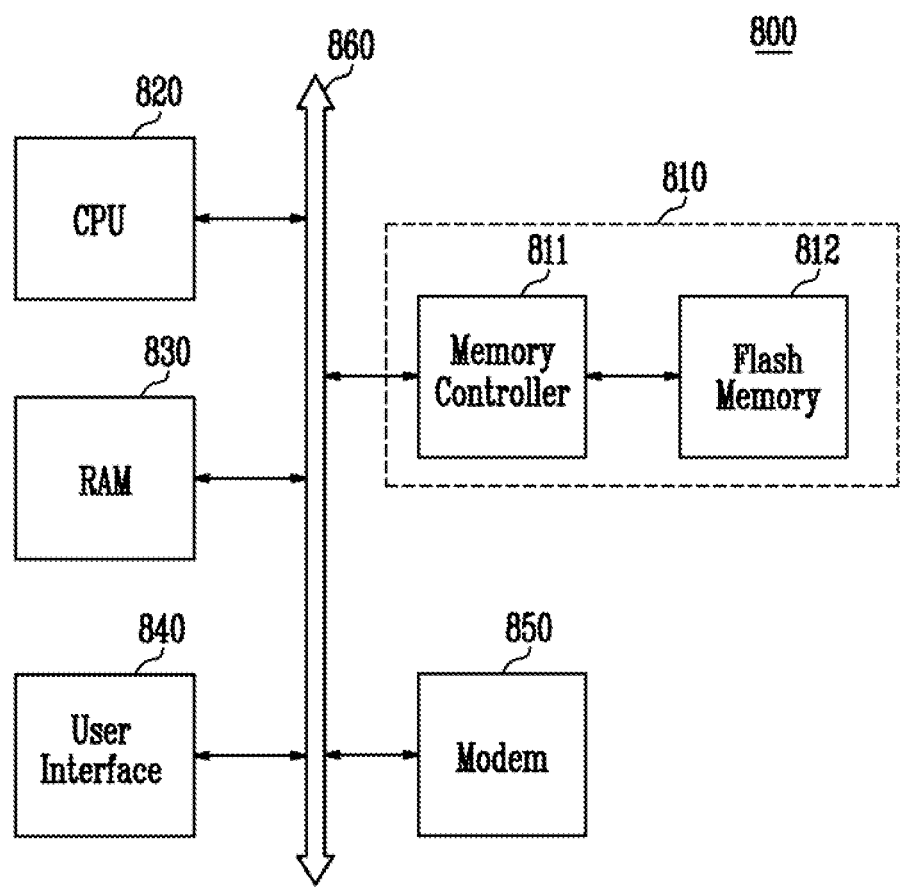
FIG. 14 is a block diagram illustrating a computing system including a flash memory device system according to the embodiment of the present invention.

FIG. 14 illustrates a computing system 1000 including a flash memory device 812 according to the embodiment of the present invention.

The computing system 800 according to the embodiment of the present invention includes a microprocessor (e.g., a CPU) 820 electrically connected to a system bus 860, a RAM 830, a user interface 840, a modem 850, such as a baseband chipset, and a memory system 810. When the computing system 800 according to the embodiment of the present invention is a mobile device, a battery (not shown) for supplying an operating voltage to the computing system 800 may be further provided. Although it is not illustrated in the drawing, it may be apparent to those skilled in the art that the computing system 800 according to the embodiment of the present invention may further include an application chipset, a Camera Image Processor (CIP), a mobile DRAM, and the like. The memory system 800 may further include, for example, an SSD using a non-volatile memory for storing data. Otherwise, the memory system 810 may be provided as a fusion flash memory, for example, a OneNAND flash memory.

Accordingly, the memory system 810 according to the embodiment of the present invention may decrease a standby current while having a high data input/output rate, and may resolve concerns occurred in a process of data transmission.

As described above, the exemplary embodiments have been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the scope of the present invention will be defined by the accompanying claims.

What is claimed is:

1. An integrated circuit, comprising:
   a memory array including a plurality of memory cells to store data;
   a page buffer unit including a first register, and configured to read the data from the memory array in response to a read request, temporarily store the data read from the memory array in the first register and output the data stored in the first register in response to a data out request;
   an input/output circuit receiving the data stored in the first register and connected with the first register via a data line; and
   a voltage supplying circuit supplying a first operating voltage to the page buffer unit, and supplying a second operating voltage that is higher than the first operating voltage to the first register included in the page buffer unit
   wherein the voltage supplying circuit supplies the first operating voltage to the page buffer while the page buffer reads the data from the memory array and increases the first operating voltage supplied to the first register to the second operating voltage in response to the data out request, and
   the second operating voltage is transmitted to the data line while the page buffer outputs the data stored in the first register to the input/output circuit in response to the data out request.

2. The integrated circuit of claim 1, wherein the voltage supplying circuit includes:
   a first voltage generator generating the first operating voltage;
   a second voltage generator generating the second operating voltage in response to the data out request by boosting the first operating voltage.

3. The integrated circuit of claim 1, wherein the page buffer is configured to receive program data from the input/output circuit, and
   the voltage supplying circuit supplies the second operating voltage to the page buffer unit while the page buffer receives the program data from the input/output circuit.

4. A semiconductor memory device, comprising:
   a memory array including a plurality of memory cells that store data;
   a page buffer including a first latch temporarily storing the data read from the memory cells and outputting the data stored in the first latch to an input/output circuit, the input/output circuit connected to the first latch via a data line; and
   a voltage supplying unit supplying a first operating voltage to the first latch, and supplying a second operating voltage that is higher than the first operating voltage to the first latch,
   wherein the data line is driven by the first latch with the second operating voltage while the page buffer outputs the data stored in the first latch to the input/output circuit via the data line.

5. The semiconductor memory device of claim 4, wherein the page buffer further includes a second latch, and
   the voltage supplying unit supplies the first operating voltage to the second latch while the page buffer outputs the data stored in the first latch to the input/output circuit.

6. The semiconductor memory device of claim 4, wherein the voltage supplying unit includes:
   a first voltage generator generating the first operating voltage in response to a first control signal; and
   a second voltage generator generating the second operating voltage in response to a second control signal by boosting the first operating voltage.

7. The semiconductor memory device of claim 6, wherein the control logic activates the second control signal after the data read from the memory cells is stored in the first latch and before the data stored in the first latch is output from the first latch.

8. The semiconductor memory device of claim 6, wherein the page buffer outputs the data stored in the first latch in response to a random data output confirm command.

9. The semiconductor memory device of claim 8, further comprising:
   a control logic activating the second control signal in response to a second command, wherein the control logic activates the second control signal after the data is stored in the first latch by the second command and before the data is output from the first latch in response to the random data output confirm command.

10. A method of operating a semiconductor memory device, comprising:
supplying an operating voltage to a first latch and a second latch in a page buffer;
reading data from a memory array and storing the data in the first latch using the operating voltage;
boosting the operating voltage in response to a random data output request;
supplying the boosted operating voltage to the first latch; and
outputting the data stored in the first latch to an input/output circuit via a data line,
wherein the boosted operating voltage is transmitted to the data line during the outputting of the data.

11. The method of claim 10,
wherein the data is stored in the first latch after the operating voltage is supplied to the first latch and the second latch.

12. The method of claim 10, wherein the storing of the data read includes:
inputting a read setup command;
inputting an address corresponding to the read operation;
inputting a read confirmation command; and
changing a current state to a busy state and performing a read operation in response to input of the read continuation command.

13. The method of claim 12, wherein the operating voltage is boosted before the current state is changed from the busy state to a ready state.

14. The method of claim 10, wherein the data is random data.

15. The method of claim 14, further comprising, after the supplying of the operating voltage,
inputting a random data output command;
inputting an address for outputting the random data; and
inputting a random data output confirmation command,
wherein the control signal is activated in response to input of the random data output confirmation command.

* * * * *